Feb. 11, 1964 B. P. VIGNERON 3,121,175

TRANSISTOR HAVING THRESHOLD SWITCH EFFECTING COUPLING AND FEEDBACK EFFECTING TEMPERATURE COMPENSATION

Filed Aug. 3, 1959

INVENTOR

BY BERNARD P. VIGNERON

United States Patent Office 3,121,175
Patented Feb. 11, 1964

3,121,175

TRANSISTOR HAVING THRESHOLD SWITCH EFFECTING COUPLING AND FEEDBACK EFFECTING TEMPERATURE COMPENSATION

Bernard Pierre Vigneron, Maisons-Alfort, France, assignor to Compagnie Francaise Thomson-Houston, Paris, France Filed Aug. 3, 1959, Ser. No. 831,399
10 Claims. (Cl. 307—88.5)

This invention generally relates to semi-conductor switching circuits and more particularly to grounded-emitter transistor amplifier switches.

The use of transistor amplifier switches is common and their circuit structure is relatively simple, but great difficulties are presented when a number are connected in cascade in a switching circuit.

Such a switching circuit consists, in general, of a plurality of direct-coupled grounded-emitter transistor amplifier switches. When one transistor switch is rendered conductive, a slight and undesirable voltage appears between its collector and ground. It is difficult to prevent this voltage from switching a succeeding switch to its conductive state.

A second difficulty is caused by the variation of the various parameters of the transistors with temperature. In brief, the open-emitter collector current $I_{co}$ varies exponentially with temperature so that if one transistor switch is cut off, its operating point is unfavorably modified by an increase in its temperature, from which it results that a succeeding transistor switch is not rendered conductive to the point of saturation. Under these conditions, this succeeding transistor switch may not cut off a next succeeding transistor switch which it directly controls.

It is common practice to compensate for temperature instability in direct-coupled transistor amplifier circuits having stages of the grounded-emitter configuration by connecting a negative feedback element in the emitter circuit of each stage. However, if such an amplifier is to be utilized as a switching circuit, it is not possible to compensate for temperature instability by means of a negative feedback device in the emitter circuit. Instead, transistors having proper characteristics must be selected and delicate adjustments must be made.

The principal object of this invention is to provide an improved semiconductor switch which does not have the defects of the prior art.

A further object is to stabilize the operation of a semiconductor switch.

Another object is to isolate cascaded switches so that the operation of one switch is not sensitive to undesired variations in the operation of a preceding switch.

Still another object is to provide a semiconductor switch which is insensitive to noise.

In accordance with the illustrated embodiments of this invention, a threshold device is connected between the control electrode of a semiconductor switch and an input terminal to which a control signal is applied. The control electrode is biased to hold the switch off until the control signal reaches a predetermined threshold voltage. When it goes beyond this threshold voltage, the high impendance of the threshold device diminishes abruptly and the control signal is applied to the control electrode to render the semiconductor switch conductive.

Other objects and applications of the invention will appear from the following description, with reference to the drawing in which.

Figure 5:
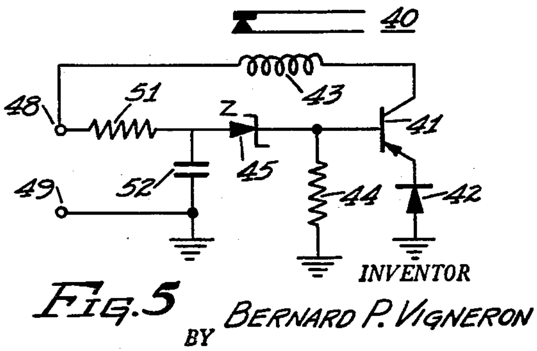

FIG. 5 illlustrates a method of using a switch of this invention for timed control of a relay.

Figure 1:
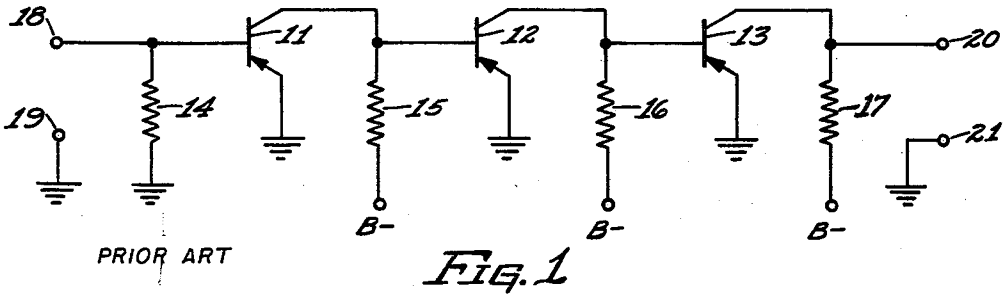
PRIOR ART FIG. 1
FIG. 1 illustrates a switching circuit of a type known in the prior art.

In order to better understand the present invention, the structure, operation and defects of a transistor switching circuit of a known type will first be briefly described. Such a switching circuit is shown in FIG. 1 as having three transistors 11, 12 and 13 of the PNP type, each connected in a grounded-emitter configuration. The base of transistor 11 is connected to ground or a point of reference potential by a resistor 14. The collectors of transistors 11, 12 and 13 are connected to a suitable source of negative direct voltage B— through respective load resistors 15, 16 and 17. The base of transistor 12 is directly connected to the collector of the preceding transistor 11. Similarly, the base of the third transistor 13 is directly connected to the collector of transistor 12. Input terminals 18 and 19 are respectively connected to the base of transistor 11 and ground and output terminals 20 and 21 are respectively connected to the collector of transistor 13 and ground.

In operation, when the potential of terminal 18 is rendered sufficiently negative with respect to that of terminal 19, the first transistor 11 becomes conductive, and the negative potential of its collector is increased toward ground. The second transistor 12 is then cut off, as a result of which the potential of its collector tends toward that of the source of negative voltage B— and transistor 13 is rendered conductive. The potential of output terminal 20 is then approximately at ground.

If the difference of potential applied between the input terminals 18 and 19 is returned to approximately zero, a general switching of the three stages is produced. As a result, the first transistor 11 is cut off, the second transistor 12 is rendered conductive and the third transistor 13 should be cut off. However, if the temperature of the first transistor 11 increases, its collector current $I_{co}$ increases exponentially and its collector voltage becomes less negative. As pointed out hereinbefore, the next transistor 12 is then not driven to saturation and consequently the third transistor 13 may not be cut off. This is the second type of difficulty encountered in the switching circuit of the prior art as noted hereinbefore.

Again consider the condition of terminal 18 sufficiently negative with respect to terminal 19 to render the first transistor 11 conductive. It will be noted that the potential of the base of transistor 12 must be very close to ground in order that it may be cut off. Unfortunately, for a given current, the collector voltage of transistor 11 is a function of the collector current, and if the collector reaches a negative few tenths of a volt, transistor 12 becomes conductive when it ought to be cut off. This may occur with any temperature increase of transistor 11 since the emitter resistance increases with temperature, thereby increasing the negative voltage between the collector and ground. The result of this increased negative collector voltage is malfunctioning of succeeding switches in the circuit. This is the first type of difficulty encountered as noted hereinbefore.

The second difficulty of having an increase in the cut-off collector current $I_{co}$ cannot be corrected by the use of a negative feedback element connected between the emitter and ground because, when the transistor is rendered conductive, the voltage at the ungrounded terminal of such a feedback element will cause the collector to assume a negative potential when it should be substantially at ground potential. Since the coupling to the succeeding transistor switch is direct, such a negative potential would prevent the transistor of that switch from being cut off, thereby augmenting the first difficulty.

The defects of the prior art transistor switches may be corrected in accordance with the present invention by providing a threshold device between the input terminal or control electrode of the switch and the control signal source which may be a preceding switch in a circuit of cascaded switches. The switching circuit illustrated in FIG. 2 comprises three transistor switches connected in cascade, two of these switches being in accordance with this invention. The elements in FIG. 2 which are analogous to elements in FIG. 1 are designated by the same reference numerals as in FIG. 1.

Figure 2:
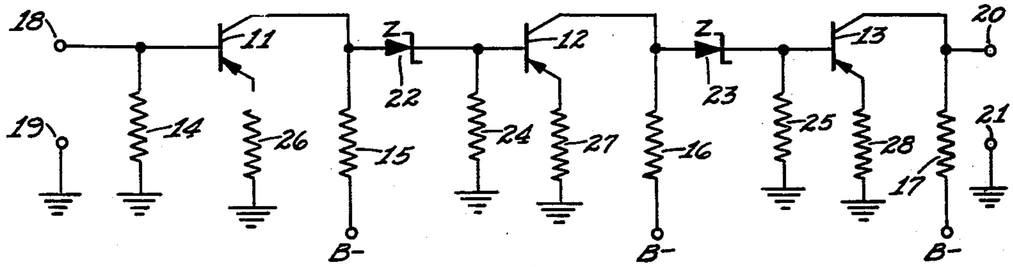
FIG. 2 is a schematic diagram of a group of switches in accordance with this invention.

The structure and operation of the switching circuit illustrated in FIG. 2 will now be described in detail. The coupling between the stages of the switching circuit are established by Zener diodes 22 and 23 which are reverse biased PN junction diodes having suitable volt-ampere characteristics. Resistors 24 and 25 connect the respective cathodes or N sides of the Zener diodes 22 and 23 to ground. The anodes or P sides of the diodes are directly connected to the respective collectors of the transistors 11 and 12.

With this arrangement, negative feedback elements 26, 27 and 28 may be introduced between ground and the emitters of the respective transistors 11, 12 and 13 since the Zener diodes isolate the successive switches in a manner to be presently described.

In operation, transistor 11 is normally in the cutoff state since its base electrode is biased through resistor 14 at approximately the same potential as its emitter. Therefore, its collector is at a potential sufficiently negative to exceed the Zener voltage of diode 22, the Zener voltage being that reverse voltage across the diode necessary to cause a large reverse current to flow through it. Diode 22 then substantially provides a short circuit between the collector of transistor 11 and the base of transistor 12 since its very large reverse current is largely independent of the voltage across it. Consequently, the base of transistor 12 is sufficiently negative to render it conductive. When transistor 12 is conducting, the potential of its collector is not sufficiently negative to exceed the Zener voltage of diode 23 so that there is, in effect, an open circuit between the collector of transistor 12 and the base of transistor 13. Consequently, the latter is in its normal nonconductive or cutoff state.

The negative feedback resistors 26, 27 and 28 compensate for variations in the temperature of their respective transistors 11, 12 and 13 to maintain their cutoff collector current $I_{co}$ stable. These negative feedback elements increase negatively the collector potential of their respective transistor switches when conducting but that increase does not have an effect on the switching action of succeeding transistors since the coupling between stages is not direct but through isolating Zener diodes. Thus, for example, the negative feedback resistor 27 stabilizes the cutoff collector current of transistor 12. When the latter is conducting, the resistor 27 has the effect of maintaining the collector at a slightly negative potential but that potential does no exceed the Zener voltage of the diode 23.

From the foregoing it can be seen that in each stage the Zener diode coupling eliminates the difficulties of the prior art since a slight negative voltage which appears between the collector of a conducting transistor and ground can not be applied to a succeeding switch through a nonconducting Zener diode. Negative feedback elements can then be used for temperature stabilization in each switch as indicated. It should also be noted that, with Zener diode coupling between stages, it is not important to have a transistor conducting at saturation when it is switched into conduction.

Figure 3:
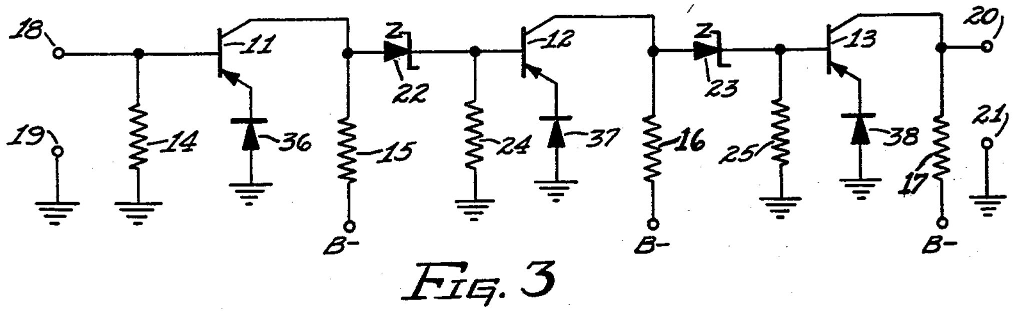
FIG. 3 is a schematic diagram of a modified group of switches in accordance with this invention.

Each transistor switch may employ a junction diode made of silicon, for example, as a negative feedback element. A switching circuit utilizing diodes 36, 37 and 38 as negative feedback elements is illustrated in FIG. 3. Each diode is biased in the forward direction or arranged to be polarized in the direction of forward conduction from ground to the emitter when its associated switch is conducting. This arrangement takes advantage of the relatively high forward resistance of such a diode to provide the high negative feedback desired to stabilize the cutoff collector current $I_{co}$ when the associated switch is cut off and the forward biasing potential applied to that diode is low. When the associated switch is conducting and high collector current is important, it is not desirable to have dynamic negative feedback. At that time, a negative feedback diode presents a low impedance in the emitter circuit of its associated switch.

Although the present invention has been disclosed in embodiments utilizing Zener diodes, it should be understood that other threshold devices having similar characteristics, such as cold-cathode gas diodes, may be used.

It should also be understood that although the embodiments disclosed utilize PNP transistor amplifier switches, other semi-conductor switches may be advantageously stabilized in accordance with the concept of this invention. For example, regenerative transistor amplifier switches employing semi-conductor triodes which exhibit a negative resistant characteristic may be used. Switches of that type are bistable and are often referred to as single transistor binary or flip-flop circuits.

Figure 4:
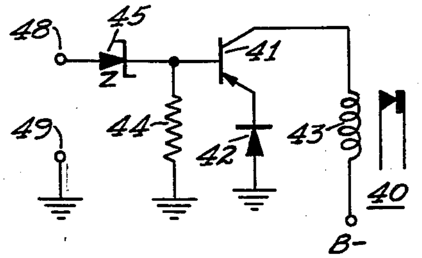
FIG. 4 illustrates a method of using a switch of this invention for the control of a relay.

FIG. 4 illustrates the manner in which the present invention may be employed as the control switch for a relay 40. A transistor 41 is connected in a grounded-emitter amplifier configuration having a negative feedback diode 42 in the emitter circuit and a solenoid 43 of the relay 40 in the collector circuit. The transistor 41 is biased below cutoff by a resistor 44 connected between its base and ground. A Zener diode 45 couples an input terminal 48 to the base of the transistor. A suitable control signal source, such as a transistor amplifier switch, may be connected between the input terminal 48 and a grounded terminal 49.

It is apparent that the operation of this relay control switch is stabilized since it is insensitive to noise or temperature variations in the control signal and the current amplitude it supplies to the relay is substantially independent of the control signal amplitude. This invention permits stable operation of the relay not only with wide variations in the control signal but also with wide variations in the temperature of the transistor 41 because it makes possible the inclusion of the feedback element 42 even though other switches may be connected to it in cascade.

The present invention may also be employed in a time delay relay control switch as shown in FIG. 5. For this purpose a resistor 51 is connected between the input terminal 48 and the Zener diode 45. A capacitor 52 is connected to ground from the junction of the resistor 51 and the diode 45. The solenoid 43 of the relay 40 is connected to the input terminal 48 instead of to a source of direct negative voltage B—.

A negative control signal of sufficient amplitude will charge the capacitor 52 negatively until the diode breakdown voltage is reached at which time the transistor 41 is rendered conductive. The control signal provides the current for the solenoid 43 as long as it is present. Thereafter, the capacitor 52 will provide the current until it is discharged below the breakdown voltage of the Zener diode 45, at which time the transistor 41 is cut off. The cutoff collector current $I_{co}$ will continue discharging the capacitor 52 but that current is insufficient to hold the relay closed.

While the principles of the invention have now been made clear in an illustrative embodiment, there will be immediately obvious to those skilled in the art many modifications in structure, arrangement, proportions, the elements, material, and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What is claimed is:

1. A switch comprising: a semiconductor having an emitter, a collector, and a base; means for applying a first reference potential to said emitter; impedance means for applying a second bias potential to said collector; impedance means for applying said first reference potential to said base; an input terminal; a threshold device having a predetermined breakdown voltage connected between said input terminal and said base; means for applying a third potential of the polarity of said second bias potential to said input terminal, said third potential having an amplitude insufficient to cause the voltage across said threshold device from reaching said predetermined breakdown voltage; and means for sufficiently increasing said third potential to cause said predetermined breakdown voltage across said threshold device to be exceeded.

2. A switch as defined in claim 1 including a negative feedback impedance element connected between said emitter and said means for applying the first reference potential to said emitter for deriving a signal to maintain said semiconductor in a state of nonconduction whenever said third potential is less than the breakdown voltage of said threshold device.

3. A switch as defined in claim 2 wherein said negative feedback impedance element is a semiconductor diode.

4. A switch as defined in claim 1 wherein said threshold device is a Zener diode.

5. A switch comprising: a semiconductor having an emitter, a collector, and a base; means for applying a first reference potential to said emitter; impedance means for applying a second potential different from said first reference potential to said collector; means for applying said first reference potential to said base; an input terminal; a threshold device having a predetermined breakdown voltage connected between said input terminal and said base; means for applying a third potential to said input terminal, said third potential having a magnitude insufficient to cause the voltage across said threshold device from reaching said predetermined breakdown voltage; and means for sufficiently changing the magnitude of said third potential to cause said predetermined breakdown voltage across said threshold device to be exceeded.

6. A switch comprising: a semiconductor having an emitter, a collector, and a base; means for applying a first reference potential to said emitter; impedance means for applying a second potential different from said first potential to said collector; means for applying said first reference potential to said base; an input terminal; a threshold device for a predetermined breakdown voltage connected between said input terminal and said base; means for applying a third potential to said input terminal, said third potential having a magnitude sufficient to reverse bias said threshold device but insufficient to cause the voltage across said threshold device from reaching said predetermined breakdown voltage; and means for sufficiently changing the magnitude of said third potential to cause said predetermined breakdown voltage across said threshold device to be exceeded.

7. A switching network element comprising: at least five electrically distinct connecting points; a first semiconductor and a second semiconductor each having an emitter, a collector and a base; a first threshold device having a predetermined breakdown voltage connected between a first of said points and the base of said first semiconductor; impedance means connecting a second of said points to the base of said first semiconductor; circuit means connecting a third of said points to the collector of said first semiconductor; impedance means connected between the third and fourth of said points; a second threshold device having a predetermined breakdown voltage connected between the third of said points and the base of said second semiconductor; impedance means connected between the second of said points and the base of said second semiconductor; circut meains connecting the fifth of said points to the collector of said second semiconductor; impedance means connected between the fourth and fifth of said points; means for applying a first reference potential to said second point; means for applying a second potential different from said first reference potential to said fourth point; means for applying a third potential different from said first reference potential to the first of said points, said third potential having a magnitude insufficient to cause the voltage across said first threshold device from reaching said predetermined breakdown voltage; means for sufficiently changing the magnitude of said third potential to cause said predetermined breakdown voltage across said first threshold device to be exceeded; means for providing a first negative feedback signal from the emitter of said first semiconductor to the base of said first semiconductor to maintain said first semiconductor in its nonconductive state whenever the voltage applied to said first threshold device is less than the predetermined breakdown voltage of said first threshold device; and means for providing a second negative feedback signal from the emitter of said second semiconductor to the base of said second semiconductor to maintain said second semiconductor in its nonconductive state whenever the voltage applied to said second threshold device is less than the predetermined breakdown voltage of said second threshold device.

8. The switching network element of claim 7 wherein said first and second threshold devices are Zener diodes.

9. The switching network element of claim 7 wherein the means for providing a first negative feedback signal includes an impedance means connected between the emitter of said first semiconductor and the second of said points and the means for providing a second negative feedback signal includes an impedance member connected between the emitter of said second semiconductor and the second of said points.

10. The switching network element of claim 9 wherein the impedance means connected between the emitters of said semiconductors and the second of said points are semiconductor diodes.

References Cited in the file of this patent

UNITED STATES PATENTS

| | | |
|---|---|---|
| 2,757,286 | Wanlass | July 31, 1956 |
| 2,810,080 | Trousdale | Oct. 15, 1957 |
| 2,840,728 | Haugk et al. | June 24, 1958 |
| 2,896,094 | Moody et al. | July 21, 1959 |
| 2,913,599 | Benton | Nov. 17, 1959 |
| 2,924,724 | Booker | Feb. 9, 1960 |
| 2,947,916 | Beck | Aug. 2, 1960 |
| 2,954,483 | Ulrich | Sept. 27, 1960 |
| 2,964,655 | Mann | Dec. 13, 1960 |
| 2,986,677 | Hechler | May 30, 1961 |
| 3,050,644 | Ironside | Aug. 21, 1962 |

FOREIGN PATENTS

| | | |
|---|---|---|
| 369,578 | Great Britain | Mar. 21, 1932 |